(12) United States Patent
Caviglia et al.

(10) Patent No.: US 9,071,193 B1
(45) Date of Patent: Jun. 30, 2015

(54) SYSTEM AND METHOD FOR AUGMENTING FREQUENCY TUNING RESOLUTION IN L-C OSCILLATION CIRCUIT

(71) Applicant: CADENCE DESIGN SYSTEMS, INC., San Jose, CA (US)

(72) Inventors: Anthony Caviglia, Marriottsville, MD (US); Eric H. Naviasky, Ellicott City, MD (US); Hugh Thompson, Ellicott City, MD (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 14/055,716

(22) Filed: Oct. 16, 2013

(51) Int. Cl.
*H03B 5/12* (2006.01)
*H03B 1/00* (2006.01)

(52) U.S. Cl.
CPC ........................................ *H03B 1/00* (2013.01)

(58) Field of Classification Search
CPC ............................. H03B 5/1256; H03B 5/1258
USPC ......................... 331/167, 117 R, 117 FE, 181
See application file for complete search history.

(56) References Cited

U.S. PATENT DOCUMENTS

| | | | |
|---|---|---|---|
| 7,362,194 B2 * | 4/2008 | Komurasaki et al. | 331/181 |
| 2008/0278250 A1 * | 11/2008 | Hung et al. | 331/117 R |
| 2013/0141176 A1 * | 6/2013 | Andrabi et al. | 331/117 FE |
| 2013/0314168 A1 * | 11/2013 | Sinoussi et al. | 331/167 |

OTHER PUBLICATIONS

Yao, C.; "A 2.8-3.2 GHz Fractional-N Digital PLL With ADC-Assisted TDC and Inductively Coupled Fine-Tuning DCO"; IEEE Journal of Solid-State Circuits; vol. 48, No. 3; Mar. 2013; pp. 1-13.
Fanori, L., et al.; "Capacitive Degeneration in LC-Tank Oscillator for DCO Fine-Frequency Tuning"; IEEE Journal of Solid-State Circuits; vol. 45, No. 12; Dec. 2010; pp. 2737-2745.
Chen, Y., et al.; "A 9 GHz Dual-Mode Digitally Controlled Oscillator for GSM/UMTS Transceivers in 65 nm CMOS"; IEEE Asian Solid-State Circuits Conference; Nov. 12-14, 2007.
Vercesi, L., et al.; "A Dither-Less All Digital PLL for Cellular Transmitters"; IEEE Journal of Solid-State Circuits; vol. 47, No. 8; Aug. 2012; pp. 1908-1920.

* cited by examiner

*Primary Examiner* — Joseph Chang
(74) *Attorney, Agent, or Firm* — Rosenberg, Klein & Lee

(57) ABSTRACT

A system and method are provided for augmenting frequency tuning resolution in an L-C oscillatory circuit which comprises a source of electrical energy, and a tuned section energized by said source of electrical energy for oscillatory conduction of a resonant current therethrough. The tuned section includes an inductor portion extending in substantially looped manner between first and second connection points to define at least one turn. A primary capacitor portion is connected across at least a primary segment of the conductive member delineated by the first and second connection points. The tuned section further includes a secondary capacitor portion connected across a secondary segment of the conductive member intermediately tapped from the primary segment. The secondary capacitor portion defines a base tuning capacitance for the tuned section, which is down-converted to a fine tuning capacitance when reflected to a calibration capacitance of the primary capacitor portion for adjustable combination therewith.

19 Claims, 8 Drawing Sheets

SYSTEM AND METHOD FOR AUGMENTING FREQUENCY TUNING RESOLUTION IN L-C OSCILLATION CIRCUIT

BACKGROUND OF THE INVENTION

The present invention is generally directed to a system and method for the precisely controlled tuning of oscillation frequency generated for use in various electronic applications. More specifically, the present invention is directed to a system and method for optimizing the incremental adjustability of oscillation frequency in systems that employ inductive-capacitive (L-C) resonance circuits to generate the oscillation. The subject system and method provide for down-converting the actual capacitance contributed by the capacitor portions of such resonance circuits, to reduce the incremental change in capacitance they may realize, and thereby augment their capacitive tuning resolution.

Advances in the electronics industry continue to yield smaller device geometries and higher speeds of circuit operation. As a result, demand continues to rise for ever more precise control of frequency references generated during phase locked loop and other such timing-sensitive applications. Oscillation circuits, such as Voltage Controlled Oscillators (VCO), have traditionally found use in many applications. More recently, Digital Phase-locked loops (DPLL's) employing Digitally Controlled Oscillators (DCO's) are becoming more prevalent in various applications to provide digitally programmable frequency references. While the digital control makes for precise selection from available frequency levels, the incremental steps between frequency levels presents certain challenges. The incremental step size must be sufficiently fine, for instance, to meet jitter requirements in most cases. That is, the frequency must be adjustable with sufficiently fine resolution to meet applicable performance requirements. The required fineness is normally not attainable simply by appropriate selection of device attributes. The requisite attributes are often beyond the physical limits of known fabrication processes for devices.

For example, in digital oscillation systems employing so-called tank, or inductive-capacitance resonant, circuits (L-C DCO), frequency may be tuned by selectively varying the tank capacitance in small incremental steps. But the capacitance step size required in many cases is well below the minimum capacitance size of any capacitor device that may actually be realized physically with device fabrication processes heretofore known in the art. Consequently, various measures have been taken in the art to nonetheless attain the desired degree of tuning resolution, though each is not without notable drawbacks and practical limitations.

Examples of such measures are disclosed in the following publications: Fanori et al., "Capacitive Degeneration in LC-Tank Oscillator for DCO Fine-Frequency Tuning," *IEEE Journal of Solid-State Circuits*, vol. 45, no. 12 (December 2010); Vercesi et al., "A Dither-Less All Digital PLL for Cellular Transmitters," *IEEE Journal of Solid-State Circuits*, vol. 47, no. 8 (August 2012); Chen et al., "A 9 GHz Dual-Mode Digitally Controlled Oscillator for GSM UMTS Transceivers in 65 nm CMOS," *IEEE Asian Solid-State Circuits Conference* (November 2007); and Yao et al., "A 2.8-3.2-GHz Fractional-N Digital PLL with ADC-assisted TDC and Inductively Coupled Fine-Tuning DCO," *IEEE Journal of Solid-State Circuits*, vol. 47, no. 3 (March 2013).

In one approach, high-speed dithering is employed to get around this physical limitation in capacitor size. Techniques such as Delta-Sigma Modulator (DSM) dithering are used to reduce the effective DCO step size enough to keep the quantization noise to levels below an analog DCO noise floor. Because they generally involve adding uncorrelated noise to a given input signal in order to average out noise levels, these dithering techniques may provide an undue source of charge injection phase noise, especially if not properly re-timed with a DCO clock mechanism.

Other approaches known in the art seek to avoid this problem by incorporating various techniques to effectively reduce the switched capacitors used in fine tuning the adjustment step size. In one such approach, a differential, cross-coupled pair of MOSFET transistors disposed between course and fine tuning capacitors of an L-C tank circuit is capacitively degenerated to "shrink" the effective tank capacitance as a function of the pair's MOS transconductance $g_m$. The differential pair is essentially diminished in quality factor (based on $g_m$ and the equivalent capacitance at the tank) to yield a reduction in the equivalent tank capacitance. While capacitance shrink factors on the order of 250 may be achieved in this manner under certain conditions, capacitor size must be set dependent upon MOS transconductance $g_m$ which fluctuates with process and temperature. Moreover, multiple capacitance "legs" of the tank circuit must be used to optimally control current to differential pair's capacitive degeneration "leg."

In another approach, relatively small capacitors are added in series with a fine tuning capacitor (varactor) array of an L-C tank circuit to form a capacitive divider. This serves to scale down the capacitance of each unit cell of the varactor array is switched during operation. Under certain conditions, frequency step sizes on the order of 1.5 kHz for a 2 GHz carrier frequency output have been realized, corresponding effectively to an incremental capacitance step of 23 aF in 65 nm CMOS technology. Still, the considerable drawbacks of this approach include its undue sensitivity to parasitic capacitances which leads to excessive variation between designed and actually realized step sizes. The inclusion of multiple metal capacitors positioned about a varactor array leads to inefficient consumption of precious chip area. The minimum realizable capacitance of metal capacitors also tends to be relatively large in size; hence, their use inherently limits the range of realizable step sizes.

In yet another approach, a one-turn coupling loop is disposed within a two-turn spiral on-chip inductor of an L-C tank circuit. The coupling loop is isolated from the inductor to form a transformer therewith. A pair of cross-coupled CMOS transistors and a level-2 course tuning capacitor bank are connected to the inductor, while a level-1 course tuning capacitor bank and a fine tuning capacitor bank are separately connected to the coupling loop. The capacitance applied to the coupling loop is found to be reduced by a factor of 16.6 when translated to the inductor, yielding a 20 kHz frequency step size for a 3.2 GHz carrier frequency output under certain conditions.

This approach transforms the high-swing waveforms appearing at the tank circuit's output nodes to low-swing waveforms for varactors employed in the level-1 course tuning capacitor bank and a fine tuning capacitor banks connected to the coupling loop. This improves the apparent linearity of the varactors at the coupling loop. Nonetheless, the inductor's quality factor Q is degraded by the coupling loop. To keep Q degradation within tolerable limits, the coupling loop's capacitive loading must be limited accordingly. Limiting the quality factor degradation to at most 3.5% under certain conditions, for example, requires the capacitive load at the coupling loop to be kept less than 3 pF. There is also the theoretical potential for multiple peaks in the coupling loop's frequency response, as a high-order system may be formed by virtue of the coupling loop's stronger coupling to the inner turn of the inductor than to the outer turn.

There is therefore a need for a system and method which accurately and reliably provide ample fineness in frequency tuning resolution, without the many drawbacks plaguing these and other approaches heretofore known in the art. There is a need for a system and method which provide a reduction in the incremental step size by which capacitance may be adjusted toward that end in an L-C oscillation circuit, and beyond the physical limits imposed on individual devices by their fabrication processes.

SUMMARY OF THE INVENTION

It is an object of the present invention to provide a system and method for reducing the incremental step size for adjusting frequency in an oscillation circuit.

It is another object of the present invention to provide a system and method for augmenting capacitive tuning resolution in an L-C oscillation circuit.

It is a further object of the present invention to provide a system and method for augmenting the resolution of frequency tuning in a digitally controlled oscillator.

These and other objects are attained in a system formed in accordance with an exemplary embodiment of the present invention for augmenting frequency tuning resolution in an L-C oscillatory circuit which comprises a source of electrical energy, and a tuned section energized by said source of electrical energy for oscillatory conduction of a resonant current therethrough. The tuned section includes an inductor portion having a conductive member extending in substantially looped manner between first and second connection points to define at least one turn. A primary capacitor portion is connected across at least a primary segment of the conductive member delineated by the first and second connection points. The primary capacitor portion substantially defines a calibration capacitance for the tuned section. The tuned section further includes a secondary capacitor portion connected across a secondary segment of the conductive member intermediately tapped from the primary segment. The secondary capacitor portion defines a base tuning capacitance for the tuned section. The base tuning capacitance is down-converted to a fine tuning capacitance when reflected across the calibration capacitance for adjustable combination therewith. The base tuning capacitance is thereby down-converted responsive to a predetermined geometric relationship between the primary and secondary segments.

A method formed in accordance with an exemplary embodiment of the present invention for augmenting frequency tuning resolution in an L-C oscillatory circuit comprises establishing a source of electrical energy, and establishing a tuned section energized by the source of electrical energy for oscillatory conduction of a resonant current therethrough. An inductor portion is established in the tuned section, having a conductive member extending in substantially looped manner between first and second connection points to define at least one turn. A primary capacitor portion is established in the tuned section to be connected across at least a primary segment of the conductive member delineated by the first and second connection points. The primary capacitor portion substantially defines a calibration capacitance for the tuned section. The conductive member is intermediately tapped from the primary segment to delineate a secondary segment. A secondary capacitor portion is connected across the intermediately tapped secondary segment, such that a base tuning capacitance defined by the secondary capacitor portion for the tuned section is down-converted to a fine tuning capacitance upon reflection across the calibration capacitance for adjustable combination therewith. The base tuning capacitance is down-converted responsive to a predetermined geometric relationship between the primary and secondary segments.

In certain exemplary embodiments of the present invention, a digitally controlled oscillator system having augmented tuning resolution for L-C oscillation frequency comprises a source of electrical energy, an amplifier section coupled to the source, and a tuned section energized through the amplifier section for oscillatory conduction of a resonant current therethrough. The tuned section includes an inductor portion having a looped conductive member integrated onto a substrate to extend between first and second connection points and define at least one turn. A primary capacitor portion is connected across at least a primary segment of the conductive member delineated by the first and second connection points. The primary capacitor portion is reconfigurable to selectively define a course tuning capacitance for the tuned section. The tuned section further includes a secondary capacitor portion connected across a secondary segment of the conductive member intermediately tapped from the primary segment. The secondary capacitor portion is variable in capacitance to selectively define a fine tuning capacitance for said tuned section. The fine tuning capacitance is down-converted to a reduced incremental tuning capacitance according to a predetermined geometric relationship between the primary and secondary segments when reflected to the primary segment for adjustable combination with the course tuning capacitance.

DESCRIPTION OF THE PREFERRED EMBODIMENTS

Figure 1A:
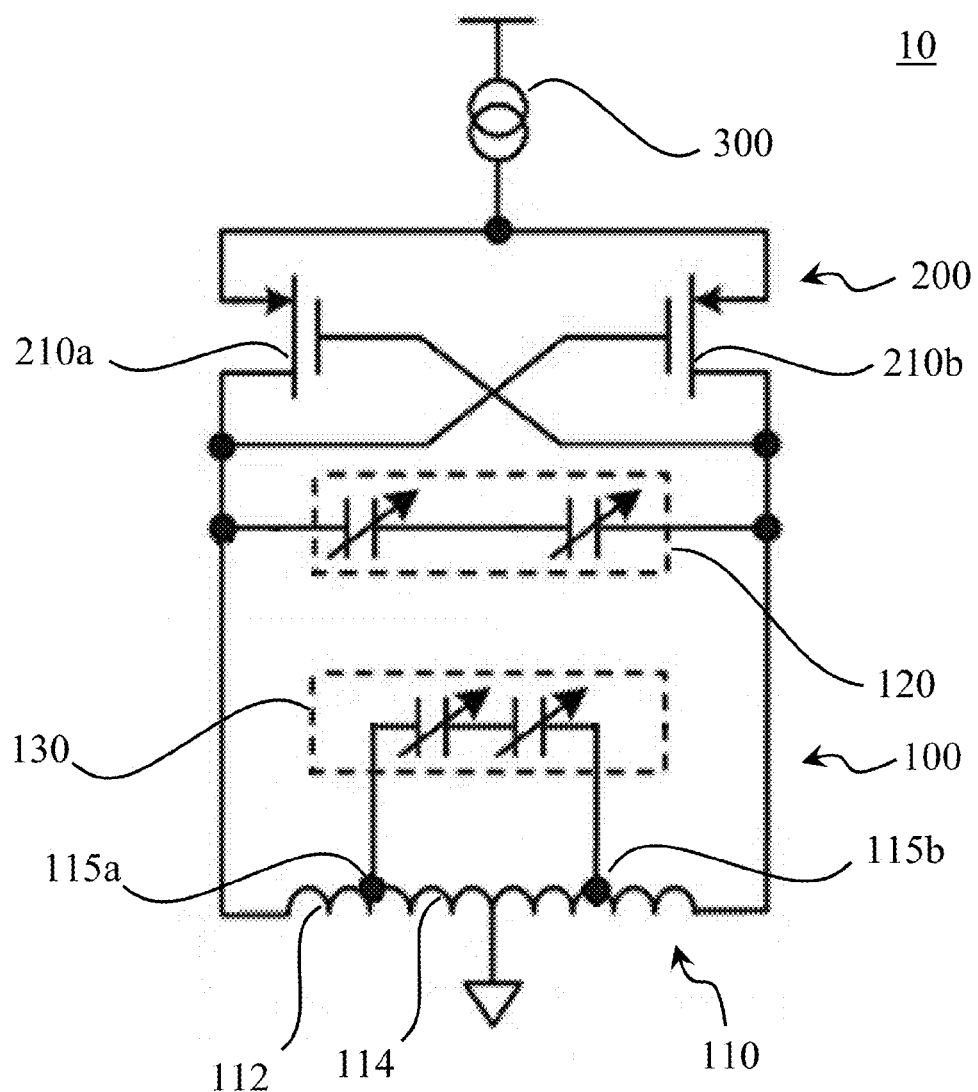
FIG. 1A is a schematic diagram of an oscillator system formed in accordance with one exemplary embodiment of the present invention.

Generally, a system and method formed in accordance with certain embodiments of the present invention provide for augmenting the frequency tuning resolution of a circuit oscillating due to L-C resonance. The system and method do so by reducing the incremental step size by which the resonant frequency may be adjusted. Since the resonant frequency may be adjusted by suitably adjusting the capacitance in the circuit, the system and method reduce the incremental frequency adjustment step size by accordingly reducing the incremental step size for varying the circuit's effective capacitance. The system and method contemplate the fact that simply using capacitive devices of sufficiently small size to reduce the incremental adjustment is not a feasible option in many applications—either because it is prohibitively expensive (in cost and/or available resources like chip area), or because it simply cannot be realized physically with known fabrication processes.

The subject system and method, therefore, leverages the impedance reduction which results when load impedance connected across an autotransformer's secondary winding segment is reflected to the impedance at the autotransformer's primary winding segment. In particular, the inductor portion of a given L-C oscillatory circuit is treated as the primary winding segment of the autotransformer, and a primary capacitor portion is connected across that primary winding segment via connection points on the inductor portion. The same inductor portion is also intermediately tapped to serve as the autotransformer's secondary winding segment, across which a secondary capacitor portion is then connected across. Because of such autotransformer configuration, the capacitance of the secondary capacitor portion actually reflected to the primary winding side is reduced, or essentially down-converted, by a squared factor of the turns ratio between the primary and secondary windings. Thus, the secondary capacitor portion's actual contribution to the overall effective capacitance (when combined with the primary capacitor portion) is substantially less than its actual capacitance value. The secondary capacitor portion appears to the primary capacitor portion to be significantly less in capacitance than it actually is.

In this way, the incremental adjustment in capacitance contributed by the secondary capacitor portion may be far smaller in step size than the minimum capacitance value physically realizable therefor. Depending on where the tank inductor is tapped for connection of the secondary capacitor portion, the magnitude of reduction (or step down/scaling factor) for the secondary capacitor portion's reflected capacitance may be selectively varied. Preferably, a plurality of intermediate taps are provided along the inductor portion in certain embodiments to provide multiple pairings of intermediate taps for selectable connection of the secondary capacitor portion thereacross, with each pairing of intermediate taps representing a different predetermined reduction/down-conversion factor. This affords much flexibility to the user, who may selectively configure the capacitance down-conversion factor by simply choosing from the available pairs of intermediate taps for the secondary capacitor portion's connection.

Referring now to FIG. 1A, a system 10 formed in accordance with one exemplary embodiment of the present invention is illustrated in simplified schematic form. In this particular embodiment, system 10 is illustratively implemented for a digitally controlled oscillation circuit application, incorporating an L-C tank type oscillatory circuit configuration. One skilled in the art will readily recognize that the subject system is not necessarily limited to the illustrated application, and that it may be implemented with numerous variations in circuit topology, circuit components, device types, unit configurations, relative polarities, and the like even within oscillatory circuit application of the type shown.

System 10 generally includes a tuned circuit section 100 which is coupled to a suitable source 300 of electrical energy by an amplifier section 200. The tuned section 100 generally incorporates an L-C oscillatory tank circuit configuration, where the inductive and capacitive components rapidly alternate storing and releasing energy. As the energy oscillates back and forth between the L-C components, an alternating current is generated through them, oscillating at a resonant frequency of the circuit. The intrinsic resistance of a physically implemented tank circuit would cause the energy, hence the oscillations, to eventually dissipate.

The amplifier section 200 couples the tuned section 100 in suitably switched manner to an energy source 300, such as the current source shown, to continually restore the lost energy and sustain the oscillations over a desired period of operation. The amplifier section 200 may be implemented in any suitable manner known in the art toward that end. In the exemplary embodiment illustrated, the amplifier section 200 is implemented to include a switching pair of identical P-channel MOSFET transistor (PMOS) devices 210a, 210b which are cross-coupled, with the gate of each PMOS device 210a, 210b tied to the drain of the other, and the source of each device tied to the current source 300. The PMOS devices 210a, 210b cooperatively serve in this configuration as a negative resistance differential pair. This is but one example, and the amplifier section 200 may be implemented in alternate embodiments using devices of other type, number, and interconnection to suit the particular requirements of the intended application.

The tuned circuit section 100 includes an inductor portion 110 coupled as shown to a primary capacitor portion 120 to define a primary loop for the resonant current generated during L-C oscillatory operation. The primary capacitor portion 120 is connected between a pair of connection points on the inductor portion 110, which in the illustrated embodiment coincide with the inductor portion's terminal ends. As shown, the primary capacitor portion 120 is thereby connected across at least a primary segment 112 delineated between the connection points of the inductor portion 110.

The tuned section 100 also includes a secondary capacitor portion 130 that is connected as shown across an intermediately tapped segment 114 of the inductor portion 110. The secondary capacitor portion 130 is connected between a pair of intermediate taps 115a, 115b preferably formed within the primary segment 112. The primary segment 112 as defined on the inductor portion 110 is preferably center tapped to ground or other source/component node of surrounding circuitry; and, the segment 114 is preferably (though not necessarily) tapped intermediately from the primary segment such that it is bisected by the center tap. This avoids various considerations that might otherwise arise in practice due to non-zero common mode. The frequency of oscillation in the tuned section 100 is determined as a function of its effective inductance and capacitance. To tune this frequency, therefore, the tuned section 100 provides for selective variation of the capacitance. One or both of the primary and secondary capacitor portions 120, 130 may be selectively varied in this regard. In the exemplary embodiment shown, system 10 is implemented as a digitally controlled oscillator, with each of the capacitor portions 120, 130 being digitally controlled in capacitance. The primary capacitor portion 120 is preferably formed as a reconfigurable bank of capacitor elements, the elements being selectively switched according to a digital word. In most applications, the primary capacitor portion 120 is used essentially for course tuning, or calibration, purposes to establish a baseline calibration capacitance value for course acquisition of oscillation frequency. The primary capacitor portion 120 need not participate in actively controlling the frequency. That is preferably reserved for the secondary capacitor portion, which provides active control of overall capacitance for fine tuning adjustment of oscillation frequency about the coarsely tuned base level.

The secondary capacitor portion 130 is preferably formed as a digitally decodable array of selectively activated varactor elements. The portion 130 is selectively set in capacitance according to one or more digital control words to the level required for realization of the desired capacitance step size when reflected to the primary side (for combination with the capacitance of the primary capacitor portion 120).

Figure 1B:
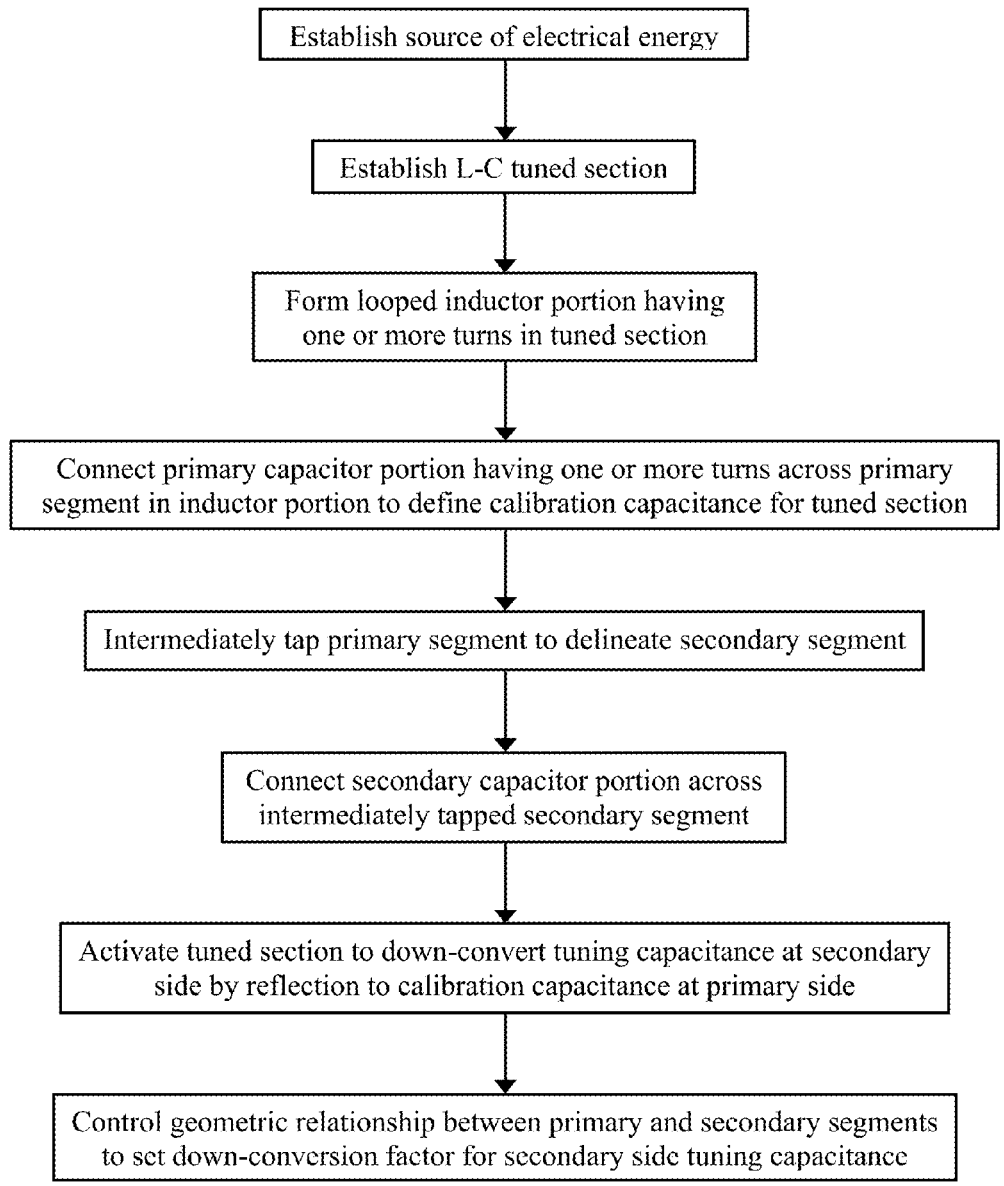
FIG. 1B is a flow diagram illustrating flow of processes in a method carried out in accordance with one exemplary embodiment of the present invention.

An exemplary flow of processes carried out to implement the frequency tuning augmentation according to certain aspects of the present invention is illustrated in FIG. 1B. As there shown, an L-C tuned section established as described in preceding paragraphs enables the down-conversion of a tuning capacitance physically provided by a secondary capacitor portion connected across a secondary coil segment of an autotransformer configuration provided by intermediately tapping the tuned section inductor portion.

Figure 2:
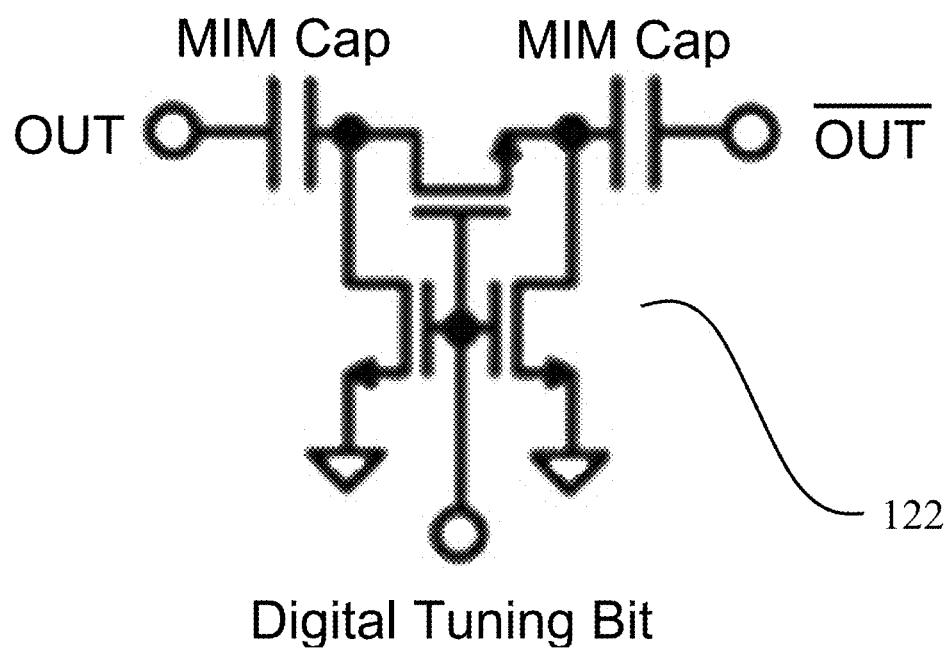
FIG. 2 is a schematic diagram illustrating an example of a selectively switched capacitive element which may be employed in the embodiment of FIG. 1.

One skilled in the art will recognize that the primary and secondary capacitor portions may be suitably implemented in numerous ways, depending on the particular requirements of the intended application. FIG. 2 illustrates one example of a selectively switched capacitive element 122 known in the art. A plurality of such elements are typically provided to form a capacitor bank, which bank may be reconfigured in overall capacitance by individually switching the transistors of each element with the corresponding tuning bit of a digital tuning word. In the example shown, each element incorporates metallic capacitors of Metal-Insulator-Metal type, which are recognized to provide accurately reproducible capacitance values, with the tradeoff of relatively large area consumption. Again, various other measures known in the art may be used to implement the primary capacitor portion 120.

Figure 3:
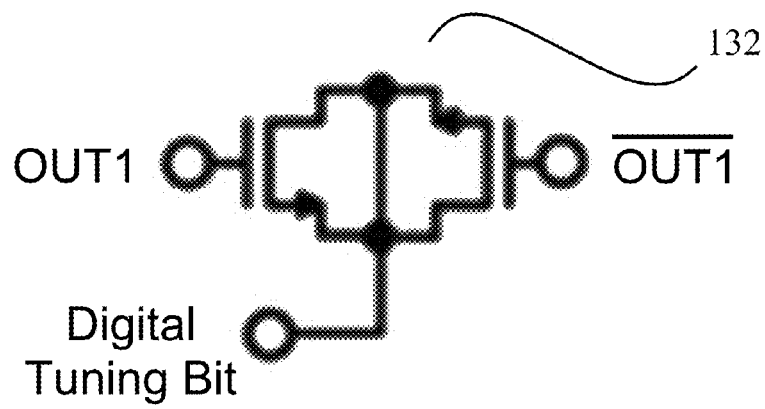
FIG. 3 is a schematic diagram illustrating an example of a digitally controlled capacitive element which may be employed in the embodiment of FIG. 1.
Figure 4:
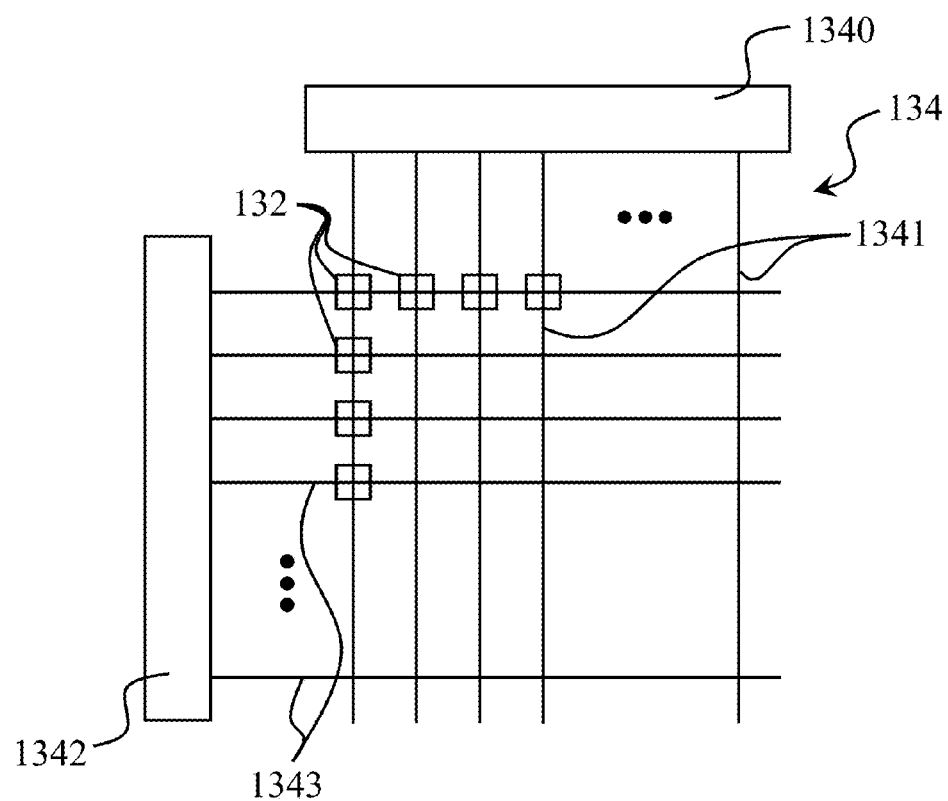
FIG. 4 is a schematic diagram illustrating an example of a digitally decodable array of elements such as shown in FIG. 3, which may be employed in the embodiment of FIG. 1.

FIG. 3 illustrates one example of a selectable capacitor element 132 known in the art, namely a digital varactor element, which may be employed in the secondary capacitor portion 130. A plurality of such varactor elements are typically provided in a decodable array for active fine tuning of capacitance. As illustrated in FIG. 4, each varactor element 132 in such array may then be addressed by respective combinations of column and row lines 1341, 1342, according to control signals provided to column and row decoders 1340, 1342. The capacitance collectively provided by the varactor elements 132 is thereby actively controlled by the digital decoding. Much as with the primary capacitor portion, this is but one of numerous measures known in the art by which the secondary capacitor portion 130 may be implemented; and, the present invention is not limited to any particular implementation.

The varactor elements 132 in the example shown may employ MOS type transistor devices, or in certain cases N-well type devices. The varactor elements, when employed, are preferably operated "on the flats" as much as possible (that is, in fully on or fully off states). Exemplary embodiments making such use of the varactor elements are found to yield typical minimum ON and OFF capacitance values (Min $C_{on}/C_{off}$) as follows: for 28 nm application, 58 aF/37 aF, for a capacitance difference of 21 aF; and for 16 nm application, 97 aF/63 aF, for a capacitance difference of 34 aF.

Figure 5:
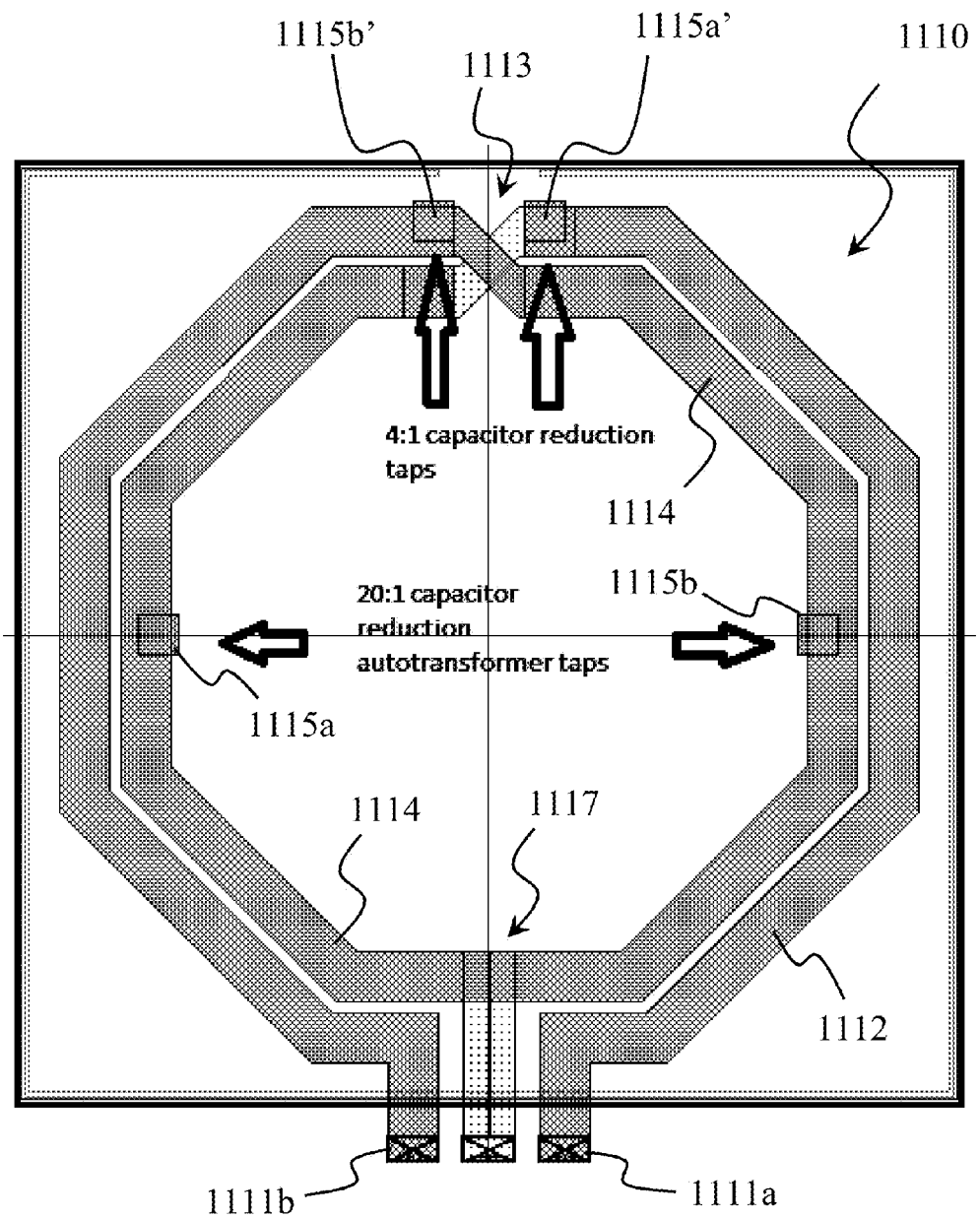
FIG. 5 is a layout diagram illustrating one example of an intermediately tapped inductor portion which may be employed in the embodiment of FIG. 1.

Turning now to FIG. 5, there is shown a physical layout of an inductor portion 1110 formed in accordance with one exemplary embodiment of the present invention. In this example, the inductor portion 1110 is implemented as an on-chip spiral inductor having two turns. The inductor portion 1110 is formed by a continuous conductive member that extends in looped manner between connection points 1111a, 1111b (crossing underneath itself at region 1113), such that each turn generally describes an octagonal contour. The conductive member is center-tapped at region 1117, and formed with a first pair of selectable intermediate taps 1115a, 1115b disposed along its length as shown. As described with reference to FIGS. 1A and 1B, the conductive member defines a primary segment 1112 extending between the connection points 1111a, 1111b. The intermediate taps 1115a, 1115b then delineate an intermediate portion of the primary segment 1112 as a secondary segment 1114. This yields the autotransformer configuration illustrated in FIG. 1A.

More than one set of intermediate taps may be provided in this regard, with each pairing of intermediate taps providing a different capacitance reduction factor. In the example of FIG. 5, a second pair of intermediate taps 1115a', 1115b' are provided as shown at different intermediate points along the length of the inductor portion's conductive member. The intermediate taps then provide the option of a 20:1 reduction in capacitance, for instance, when the secondary capacitor portion 130 is connected between the first intermediate taps 1115a, 1115b, and a 4:1 reduction in capacitance when the secondary capacitor portion 130 is connected between the other intermediate taps 1115a', 1115b'.

When the inductor portion 1110 is tapped in this manner to effectively serve as an autotransformer, the turns ratio between the resulting primary and secondary winding segments 1112 and 1114 (as defined by the respective connection points and intermediate taps) indicates the voltage reduction between the primary and secondary. Also, a load impedance connected across an autotransformer's secondary coil is reflected to its primary coil reduced in magnitude by a square of the turns ratio. The capacitance reduction factor for a secondary capacitor portion 130 connected across a pair of intermediate taps may therefore be set selectively by locating those intermediate taps to accordingly establish the turns ratio between the primary and secondary segments 1112, 1114.

In the example of FIG. 5, the secondary segment 1114 is delineated by the intermediate taps 1115a, 1115b to extend between approximately $\frac{1}{4} \sim \frac{1}{5}^{th}$ of the length of the primary segment 1112 (essentially conductive member's overall length in this case), such that the voltage and turns ratios between the autotransformer's primary and secondary coils would be approximately 4.5:1. Taking a square of this turns ratio leaves a capacitance reduction factor of approximately 20:1. The secondary capacitor portion 130 connected between the intermediate taps 1115a, 1115b would thus appear to the primary side reduced in capacitance by a factor of 20. It is that reduced capacitance which would then combine with the primary capacitor portion 120 to provide the effective tank capacitance. Thus the 'course tuning' capacitance of the primary capacitor portion 120 may be incremented by $\frac{1}{20}^{th}$ of the actual capacitance value of the secondary capacitor portion 130 that is physically connected to the intermediate taps 1115a, 1115b.

The secondary capacitor portion 130 may be down-converted in capacitance thereby, well below its minimum physically implemented limit. The incremental capacitance step in capacitance that it actually contributes to the effective tank capacitance (for the tuned section 100)—upon combination with the capacitance of the primary capacitor portion 120—is accordingly reduced. Consequently, capacitive tuning resolution for the oscillation frequency of the tuned section 100 is augmented.

The other available intermediate taps 1115a', 1115b' in the example of FIG. 5 are located to delineate the middle half of the inductor's conductive member. Connecting the secondary capacitor portion 130 between these alternative intermediate taps 1115a', 1115b' would give a turns ratio of approximately 2:1, which translates to a 4:1 down-conversion of its capacitance when reflected to the primary side. Depending on the intended application, various other intermediate tap pairs may be provided in place of, or as a supplement to, those shown in the illustrated example. Any suitable down-conversion factor may be readily provided in this manner by variably locating and spacing the intermediate taps along the given inductor portion.

Figure 6:
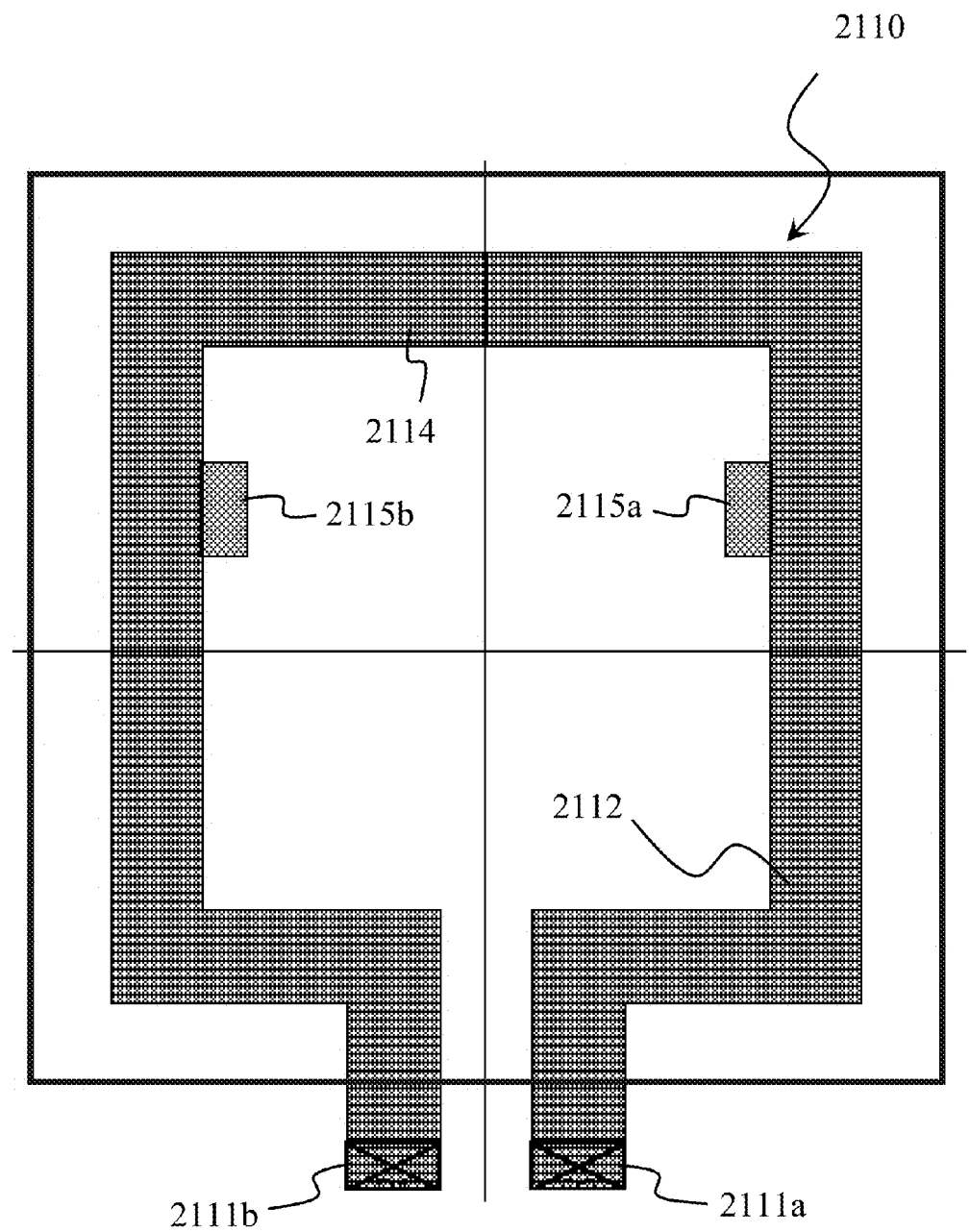
FIG. 6 is a layout diagram illustrating another example of an intermediately tapped inductor portion which may be employed in the embodiment of FIG. 1.
Figure 7:
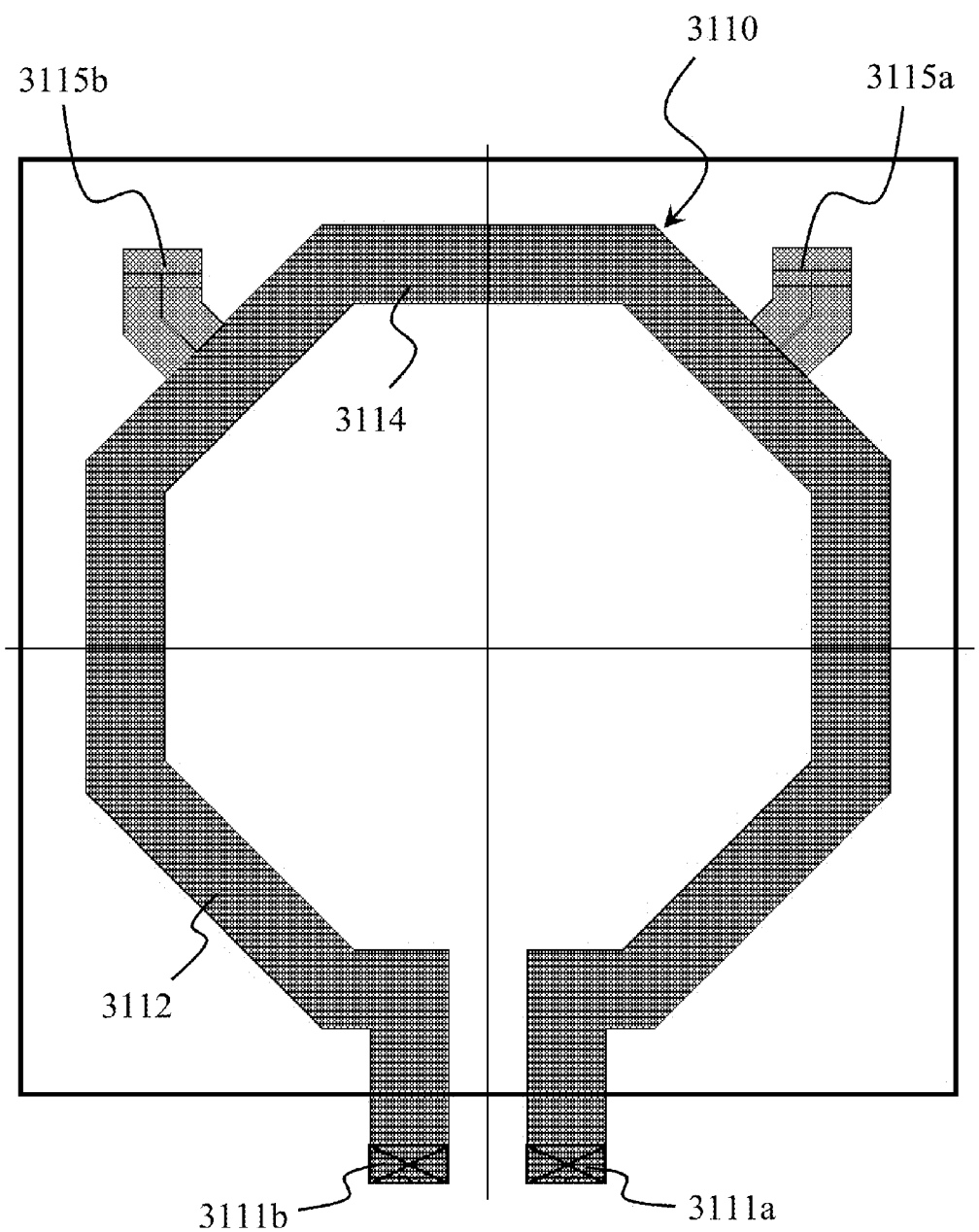
FIG. 7 is a layout diagram illustrating yet another example of an intermediately tapped inductor portion which may be employed in the embodiment of FIG. 1; and, FIG. 8 is a layout diagram illustrating still another example of an intermediately tapped inductor portion which may be employed in the embodiment of FIG. 1.

Also depending on the intended application, the inductor portion may be implemented in alternate embodiments with various other configurations. A few examples are shown for illustrative purposes in FIGS. 6-8. In FIG. 6, the inductor portion 2110 is formed by a continuous conductive member that extends in looped manner between connection points 2111a, 2111b to describe one generally rectangular turn. A pair of intermediate taps 2115a, 2115b are formed to delineate a secondary segment 2114 within a primary segment 2112 at a turns ratio (primary:secondary) of greater than 2:1 (for a capacitance down-conversion of greater than 4:1). The inductor portion 3110 of FIG. 7 extends in looped manner between its connection points 3111a, 3111b to also describe just one turn, but of generally octagonal contour. It is formed with a pair of intermediate taps 3115a, 3115b delineating a secondary segment 3114 within a primary segment 3112 at a turns ratio of approximately 4:1 (for a capacitance down-conversion of about 16:1).

Figure 8:
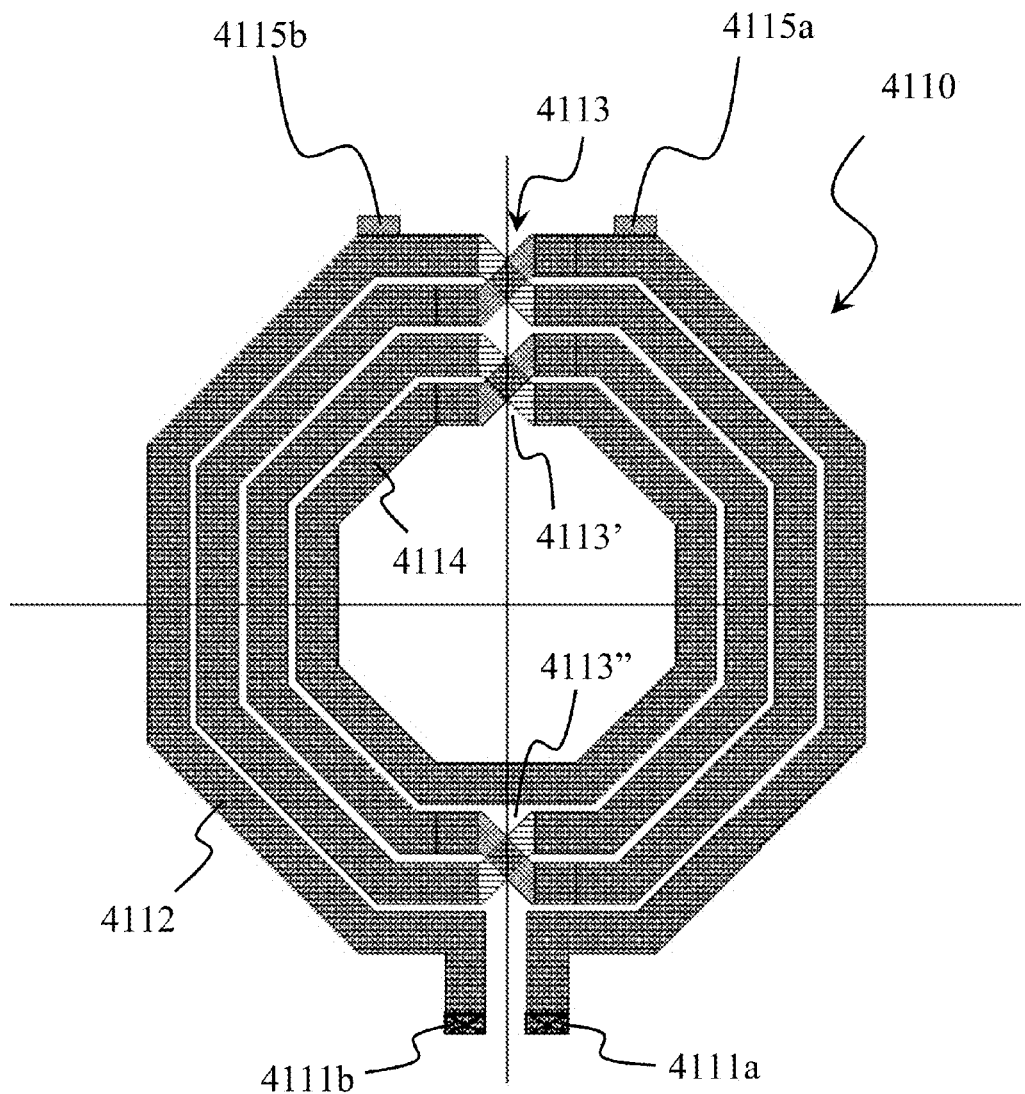

The inductor portion 4110 of FIG. 8 is formed by a continuous conductive member that extends in looped manner between connection points 4111a, 4111b, crossing underneath itself multiple times at regions 4113, 4113', 4113" to define four turns, each turn generally describing an octagonal contour. Inductor portion 4110 is formed with a pair of intermediate taps 4115a, 4115b delineating a secondary segment 4114 within a primary segment 4112 at a turns ratio of approximately 4:3 (for a capacitance down-conversion of roughly 1.8:1). While the modest down-conversion may limit the use and applicability of such embodiment in practice, the embodiment serves to illustrate the wide degree of adjustment simply and conveniently realized in accordance with certain aspects of the present invention.

L-C DCO systems formed in accordance with certain exemplary embodiments of the present invention are found to readily realize incremental frequency tuning steps of 10 kHz and 40 kHz for an output frequency on the order of 5 GHz. This incremental step size is much smaller than would be feasible within practical limits, otherwise.

Systems formed in accordance with such embodiments of the present invention afford certain notable advantages, including among others:
  Flexibility to implement multiple different capacitor reduction ratios instead of just one, giving improved degrees of freedom to the circuit designer.
  Easier inductor design, because it is a considerably less complex process to incorporate intermediate taps on an existing inductor than to design a secondary coupling loop, for example.
  Significant and versatile capacitance down conversion is realized without substantially degrading the quality factor Q of the main inductor portion.

Although this invention has been described in connection with specific forms and embodiments thereof, it will be appreciated that various modifications other than those discussed above may be resorted to without departing from the spirit or scope of the invention as defined in the appended claims. For example, equivalent elements may be substituted for those specifically shown and described, certain features may be used independently of other features, and in certain cases, particular applications of elements may be reversed or interposed, all without departing from the spirit or scope of the invention as defined in the appended claims.

What is claimed is:

1. A system for augmenting frequency tuning resolution in an L-C oscillatory circuit integrated on a chip comprising:
  a source of electrical energy; and,
  a tuned section energized by said source of electrical energy for oscillatory conduction of a resonant current therethrough, said tuned section including:
    an inductor portion formed on-chip having a conductive member extending in substantially looped manner between first and second connection points to define at least one turn;
    a primary capacitor portion connected across at least a primary segment of said conductive member delineated by said first and second connection points, said primary capacitor portion substantially defining a calibration capacitance for said tuned section;
    at least first and second pairs of conductive taps formed on chip to extend intermediately from said primary segment of said inductor portion, said first and second pairs of taps delineating respective intermediate sections of said primary segment having different lengths as selectable secondary segments corresponding to different selectable reduction factors for down-converting capacitance; and,
    a secondary capacitor portion connected across a selected one of said secondary segments of said conductive member by connection between one of said first and second pairs of conductive taps, said secondary capacitor portion defining a base tuning capacitance for said tuned section;
  wherein the base tuning capacitance is down-converted according to the selected reduction factor to a fine tuning capacitance when reflected across the calibration capacitance for adjustable combination therewith, the base tuning capacitance being down-converted responsive to a predetermined geometric relationship between said primary and secondary segments; and,
  wherein at least one of said primary and secondary capacitor portions includes an array of selectively activated capacitance elements for controlled variation in capacitance.

2. The system as recited in claim 1, wherein said first and second connection points define respective end terminals of said conductive member, and said pairs of taps are each disposed intermediately between said end terminals.

3. The system as recited in claim 2, wherein said conductive member is center tapped to define an interconnection node for said tuned section, and said pairs of intermediate taps are each bisected thereby in position along said conductive member.

4. The system as recited in claim 3, wherein each pair of said intermediate taps defines one of a plurality of selectable capacitance down-conversion ratios for said secondary capacitor portion upon connection therebetween.

5. The system as recited in claim 2, wherein:
  said conductive member of said inductor portion is integrated on a substrate to form at least one turn, with said intermediate taps extending therefrom for selective connection of said secondary capacitor portion thereacross; and, said predetermined geometric relationship including a turns ratio between said primary and secondary segments.

6. The system as recited in claim 5, wherein said conductive member of said inductor portion is formed with a spiral inductor configuration.

7. The system as recited in claim 5, wherein each turn of said conductive member describes a substantially polygonal contour.

8. The system as recited in claim 1, wherein said primary capacitor portion includes a reconfigurable bank of selectively switched metal capacitor elements.

9. The system as recited in claim 1, wherein said secondary capacitor portion is variable in capacitance, said secondary capacitor portion including a plurality of selectively activated varactor elements arranged in a digitally decodable bank.

10. A method for augmenting frequency tuning resolution in an L-C oscillatory circuit integrated on a chip comprising:
establishing a source of electrical energy;
establishing a tuned section energized by said source of electrical energy for oscillatory conduction of a resonant current therethrough;
establishing in said tuned section an inductor portion formed on-chip having a conductive member extending in substantially looped manner between first and second connection points to define at least one turn;
establishing in said tuned section a primary capacitor portion connected across at least a primary segment of said conductive member delineated by said first and second connection points, said primary capacitor portion substantially defining a calibration capacitance for said tuned section;
forming at least first and second pairs of conductive taps on chip to extend intermediately from said primary segment of said inductor portion, said first and second pairs of taps delineating respective intermediate sections of said primary segment having different lengths as selectable secondary segments corresponding to different selectable reduction factors for down-converting capacitance; and,
connecting a secondary capacitor portion across a selected one of said secondary segments of said conductive member by connection between one of said first and second pairs of conductive taps, a base tuning capacitance defined by said secondary capacitor portion for said tuned section being thereby down-converted to a fine tuning capacitance upon reflection across the calibration capacitance for adjustable combination therewith;
wherein the base tuning capacitance is down-converted according to the selected reduction factor responsive to a predetermined geometric relationship between said primary and secondary segments; and,
wherein at least one of said primary and secondary capacitor portions includes an array of selectively activated capacitance elements for controlled variation in capacitance.

11. The method as recited in claim 10, wherein said first and second connection points are established at respective end terminals of said conductive member, and said pairs of intermediate taps are each formed on said conductive member intermediately between said end terminals.

12. The method as recited in claim 11, further comprising center-tapping said conductive member to define an interconnection node for said tuned section, and positioning said intermediate taps to be bisected thereby in position along said conductive member.

13. The method as recited in claim 11, wherein:
said conductive member of said inductor portion is formed on a substrate with a spiral inductor configuration having at least one turn;
said intermediate tap pairs are established extending from said conductive member for selective connection of said secondary capacitor portion thereacross; and,
the base tuning capacitance is down-converted according to a predetermined geometric relationship including a turns ratio between said primary and secondary segments.

14. The method as recited in claim 10, wherein at least one of said primary and secondary capacitor portions is varied in capacitance to control said tuned section in frequency of oscillation.

15. The method as recited in claim 11, wherein said pairs of said intermediate taps are provided on said conductive member of said inductor portion for selective connection of said secondary capacitor portion therebetween, each pair of said intermediate taps defining one of a plurality of selectable capacitance down-conversion ratios for said secondary capacitor portion upon connection therebetween.

16. A digitally controlled oscillator system having augmented tuning resolution for L-C oscillation frequency integrated on a chip, comprising:
a source of electrical energy;
an amplifier section coupled to said source; and,
a tuned section energized through said amplifier section for oscillatory conduction of a resonant current therethrough, said tuned section including:
an inductor portion formed on-chip having a looped conductive member integrated onto a substrate and extending between first and second connection points to define at least one turn;
a primary capacitor portion connected across a primary segment of said conductive member delineated by said first and second connection points, said primary capacitor portion being reconfigurable to selectively define a course tuning capacitance for said tuned section;
at least first and second pairs of conductive taps formed on chip to extend intermediately from said primary segment of said inductor portion, said first and second pairs of taps delineating respective intermediate sections of said primary segment having different lengths as selectable secondary segments corresponding to different selectable reduction factors for down-converting capacitance; and,
a secondary capacitor portion connected across a selected one of said secondary segments of said conductive member by connection between one of said first and second pairs of conductive taps, said secondary capacitor portion being variable in capacitance to selectively define a fine tuning capacitance for said tuned section;
wherein the fine tuning capacitance is down-converted to a reduced incremental tuning capacitance according to the selected reduction factor and to a predetermined geometric relationship between said primary and secondary segments when reflected to said primary segment for adjustable combination with said course tuning capacitance; and,
wherein at least one of said primary and secondary capacitor portions includes an array of selectively activated capacitance elements for controlled variation in capacitance.

17. The system as recited in claim 16, wherein:
said predetermined geometric relationship includes a turns ratio between said primary and secondary segments;
said first and second connection points define respective end terminals of said conductive member, each said secondary segment being delineated by one of said pairs of said taps to be disposed intermediately between said end terminals; and,
said conductive member is center tapped to define an interconnection node for said tuned section, said taps being bisected thereby in position along said conductive member.

18. The system as recited in claim 16, wherein said conductive member of said inductor portion is formed with a spiral inductor configuration;
and, each turn of said conductive member describes a substantially polygonal contour.

19. The system as recited in claim 18, wherein said primary capacitor portion includes a reconfigurable bank of selectively switched metal capacitor elements; and, said secondary capacitor portion includes a plurality of selectively activated varactor elements arranged in a digitally decodable bank, said secondary capacitor portion being thereby variable in capacitance.

* * * * *